United States Patent
Song et al.

(10) Patent No.: US 7,667,221 B2
(45) Date of Patent: Feb. 23, 2010

(54) PHASE CHANGE MEMORY DEVICES AND METHODS FOR FABRICATING THE SAME

(75) Inventors: Jong-Heui Song, Seongnam-si (KR);
Yong-Sun Ko, Plano, TX (US);
Jae-Seung Hwang, Suwon-si (KR); Jun Seo, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 313 days.

(21) Appl. No.: 11/708,323

(22) Filed: Feb. 21, 2007

(65) Prior Publication Data
US 2007/0194294 A1 Aug. 23, 2007

(30) Foreign Application Priority Data
Feb. 21, 2006 (KR) .................. 10-2006-0016800

(51) Int. Cl.
*H01L 47/00* (2006.01)
(52) U.S. Cl. .................. 257/4; 257/1; 257/2; 438/900; 365/148
(58) Field of Classification Search .................. 257/1–5; 365/148; 438/900
See application file for complete search history.

(56) References Cited

U.S. PATENT DOCUMENTS 7,411,818 B1 * 8/2008 Elmegreen et al. .......... 365/163

2004/0256694 A1 12/2004 Kostylev et al.
2008/0277642 A1 * 11/2008 Zandt et al. .................. 257/4

FOREIGN PATENT DOCUMENTS

| JP | 2003-332529 A | 11/2003 |
|---|---|---|
| KR | 10-2003-0081900 A | 10/2003 |
| KR | 10-2004-0017694 A | 2/2004 |
| KR | 1020040093763 A | 11/2004 |
| KR | 1020050053255 A | 6/2005 |
| KR | 10-2006-0001091 A | 1/2006 |
| WO | WO 2006/079952 A1 * | 8/2006 |

* cited by examiner

*Primary Examiner*—Evan Pert
*Assistant Examiner*—Scott R Wilson
(74) *Attorney, Agent, or Firm*—Harness, Dickey & Pierce, P.L.C.

(57) ABSTRACT

In a phase change memory, an interlayer insulating layer is disposed on a substrate. A heater plug includes a lower portion disposed in a contact hole penetrating the interlayer insulating layer and an upper portion protruding upward over the top surface of the interlayer insulating layer. A phase change pattern is disposed on the interlayer insulating layer to cover the top surface and the side surface of the protruding portion of the heater plug. An insulating spacer is interposed between the phase change pattern and the side surface of the protruding portion of the heater plug. A capping electrode is disposed on the phase change pattern.

20 Claims, 8 Drawing Sheets

PHASE CHANGE MEMORY DEVICES AND METHODS FOR FABRICATING THE SAME

PRIORITY STATEMENT

This non-provisional U.S. patent application claims priority under 35 U.S.C. § 119 to Korean Patent Application No. 2006-16800, filed on Feb. 21, 2006, in the Korean Intellectual Property Office (KIPO), the entire contents of which are incorporated herein by reference.

BACKGROUND

Description of the Conventional Art

Conventional nonvolatile memory devices retain stored data even when powered off. Examples of conventional nonvolatile memory devices are ferroelectric memory devices, magnetic memory devices and phase change memory devices.

A unit cell of the phase change memory device uses a phase change material to store data. A phase change material changes into one of two stable sates (e.g., an amorphous state and a crystalline state), depending on the temperature and duration of supplied heat. A phase change material in an amorphous state has a higher resistivity than the phase change material in a crystalline state. The amount of current flowing through the phase change material differs according to a difference between the resistivity of the phase change material in the amorphous state and the resistivity of the phase change material in the crystalline state. Whether the stored data is a logical "1" or "0" is determined using the difference in the amount of current.

FIGS. 1 and 2 are sectional views illustrating a conventional method for fabricating a conventional phase change memory device.

Referring to FIG. 1, an interlayer oxide layer 2 is formed on a semiconductor substrate 1, and the interlayer oxide layer 2 is patterned to form a contact hole. A first conductive layer, filling the contact hole, is formed on the semiconductor substrate 1. A contact plug 3 is formed by planarizing the first conductive layer until the interlayer oxide layer 2 is exposed. A phase change layer 4 and a second conductive layer 5 are sequentially formed on the semiconductor substrate 1 including the contact plug. A mask pattern 6 covering the top surface of the contact plug 3 is formed on the second conductive layer 5.

Referring to FIG. 2, using the mask pattern 6 as an etch mask, the second conductive layer 5 and the phase change layer 4 are sequentially patterned to form a phase change pattern 4a and a conductive pattern 5a that are stacked sequentially. The phase change pattern 4a contacts the contact plug 3. At least a portion of the phase change pattern 41 corresponds to a program region 8. The program region 8 changes into an amorphous state or a crystalline state, depending on the temperature and supply duration of Joule heat generated by the contact plug 3.

In the conventional phase change memory device shown in FIG. 2, a region 7 adjacent to the side surface of the phase change pattern 4a may be damaged during an etching process using the mask pattern 6, which may change and/or degrade phase change characteristics of the region 7. The program region 8 may have a hemispheric structure surrounding the contact surface between the phase change pattern 4a and the contact plug 3. In this example, a portion of the program region 8 may belong to the damaged region 7, which may degrade characteristics of the program region 8 and lead to malfunction of the phase change memory device. As the integration degree of semiconductor devices increases, the size of the phase change pattern 4a decreases, which may emphasize and/or worsen the defects of the phase change memory device due to the damaged region 7.

SUMMARY

Example embodiments relate to semiconductor devices and methods for fabricating the same. At least one example embodiment relates to a phase change memory device and at least one other example embodiment relates to a method for fabricating the same. At least some example embodiments provide phase change memory devices capable of suppressing and/or minimizing performance degradation of a data memory unit and a method for fabricating the same. At least some example embodiments provide phase change memory devices capable of suppressing and/or minimizing performance degradation of a data memory unit by suppressing and/or minimizing an etch damage of a program region and methods for fabricating the same.

At least one example embodiment provides a phase change memory device. The phase change memory device may include an interlayer insulating layer disposed on a substrate and a heater plug including a lower portion and an upper portion. The lower portion may be disposed in a contact hole penetrating the interlayer insulating layer, and the upper portion may protrude upward over the top surface of the interlayer insulating layer. The phase change memory device may further include a phase change pattern disposed on the interlayer insulating layer to cover the top surface and the side surfaces of the protruding portion of the heater plug. The phase change pattern may contact the top surface of the protruding portion of the heater plug. An insulating spacer may be interposed between the phase change pattern and the side surface of the protruding portion of the heater plug. A capping electrode may be disposed on the phase change pattern. The bottom surface of the insulating spacer may contact the top surface of the interlayer insulating layer that is adjacent to the protruding portion of the heater plug. Alternatively, the insulating spacer may extend downward to be interposed between the lower portion of the heater plug and the inner side surface of the contact hole.

In at least some example embodiments, the phase change pattern may include a central portion contacting the top surface of the protruding portion of the heater plug, a sidewall portion contacting the insulating spacer and an edge portion extending laterally from the bottom portion of the sidewall portion. The top surface of the edge portion may be located lower than the top surface of the protruding portion of the heater plug, and the capping electrode may cover the top surface of the central portion, the outer side surface of the sidewall portion and the top surface of the edge portion, for example, continuously. The phase change memory device may further include an adhesive conductive pattern interposed between the phase change pattern and the capping electrode.

At least one other example embodiment provides a method for fabricating a phase change memory device. According to at least this example embodiment, an interlayer insulating layer may be patterned on a substrate to form a contact hole. A heater plug filling the contact hole may be formed, and the upper portion of the interlayer insulating layer may be removed such that the upper portion of the heater plug protrudes. An insulating spacer may be formed on the side surface of the protruding portion of the heater plug, and a phase change pattern contacting the insulating spacer and the top surface of the heater plug may be formed on the interlayer insulating layer. A capping electrode may be formed on the phase change pattern.

At least one other example embodiment provides a method for fabricating a phase change memory device. According to at least this example embodiment, an interlayer insulating layer disposed on a substrate may be patterned to form a contact hole. An insulating spacer may be formed on an inner side surface of the contact hole, and a heater plug may be formed to fill the contact hole having the insulating spacer. The upper portion of the interlayer insulating layer may be removed such that the upper portion of the heater plug and the upper portion of the insulating spacer protrude. A phase change pattern contacting the top surface of the heater plug and the protruding portion of the insulating spacer may be formed on the interlayer insulating layer and a capping electrode may be formed on the phase change pattern.

According to at least some example embodiments, the phase change pattern may be formed to include a central portion contacting the top surface of the protruding portion of the heater plug, a sidewall portion contacting the insulating spacer and an edge portion extending laterally from the bottom portion of the sidewall portion. In at least this example embodiment, the top surface of the edge portion may be formed lower than the top surface of the protruding portion of the heater plug, and the capping electrode may cover the top surface of the central portion, the outer side surface of the sidewall portion and the top surface of the edge portion, for example, continuously.

At least one other example embodiment provides a phase change memory device. A phase change memory according to at least this example embodiment may include an interlayer insulating layer and a heater plug disposed on a substrate. The heater plug may include a lower portion and an upper portion. The lower portion may be disposed in a contact hole formed within the interlayer insulating layer, and the upper portion may protrude upward above a top surface of the interlayer insulating layer. A phase change material pattern may be disposed on the interlayer insulating layer and may cover a top surface and side surfaces of the protruding portion of the heater plug. The phase change material pattern may contact the top surface of the upper portion of the heater plug. An insulating spacer may be arranged between the phase change material pattern and the side surface of the protruding portion of the heater plug. A capping electrode may be disposed on the phase change material pattern.

At least one other example embodiment provides a method for fabricating a phase change memory device. According to at least this example embodiment, an interlayer insulating layer may be patterned on a substrate to form a contact hole. A heater plug may be formed to have a lower portion and an upper portion. The lower portion may be disposed in the contact hole, and the upper portion may protrude upward over the top surface of the interlayer insulating layer. The heater plug may have an insulating spacer arranged at least a portion of a side surface of the heater plug. A phase change material pattern may be formed to contact the insulating spacer and a top surface of the heater plug on the interlayer insulating layer. A capping electrode may be formed on the phase change material pattern.

According to at least some example embodiments, a heater plug may be formed to fill the contact hole, and an upper portion of the interlayer insulating layer may be removed such that the upper portion of the heater plug protrudes upward over the top surface of the interlayer insulating layer. An insulating spacer may be formed on each side surface of the protruding portion of the heater plug.

According to at least some example embodiments, a substantially conformal phase change layer may be formed on the substrate, and a capping conductive layer may be formed on the phase change layer. The capping conductive layer and the phase change layer may be sequentially patterned to form the phase change material pattern and the capping electrode. An adhesive conductive pattern may be formed between the capping electrode and the phase change material pattern.

BRIEF DESCRIPTION OF THE DRAWINGS

The accompanying drawings, which are included to provide a further understanding of the present invention and are incorporated in and constitute a part of this application, illustrate example embodiments and together with the description serve to explain the principles of the present invention. In the drawings.

DETAILED DESCRIPTION OF EXAMPLE EMBODIMENTS

Figure 1:
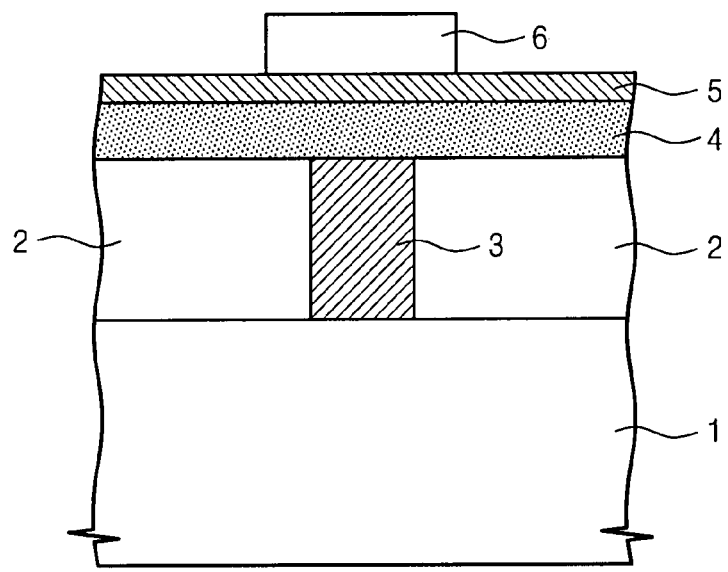
FIGS. 1 and 2 are sectional views illustrating a conventional method for fabricating a conventional phase change memory device.
Figure 2:
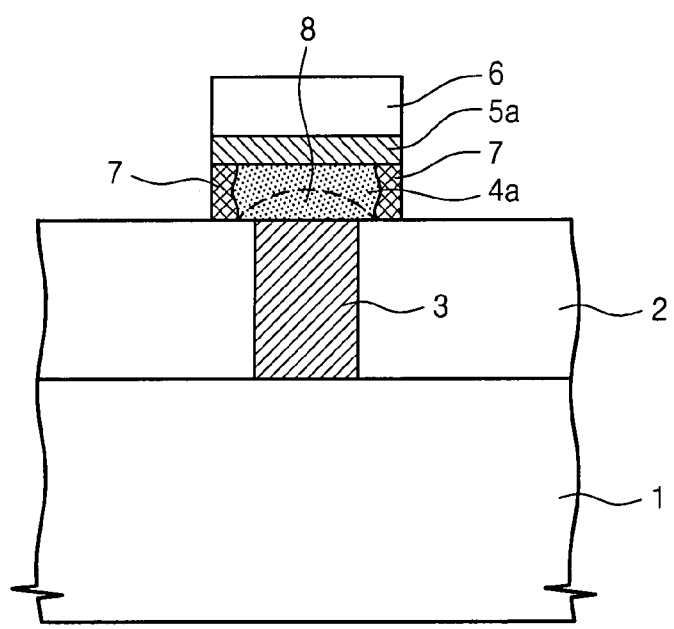

Various example embodiments will now be described more fully with reference to the accompanying drawings in which some example embodiments are shown. In the drawings, the thicknesses of layers and regions are exaggerated for clarity.

Detailed illustrative example embodiments are disclosed herein. However, specific structural and functional details disclosed herein are merely representative for purposes of describing example embodiments. This invention may, however, may be embodied in many alternate forms and should not be construed as limited to only the example embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element or layer is referred to as being "formed on" another element or layer, it can be directly or indirectly formed on the other element or layer. That is, for example, intervening elements or layers may be present. In contrast, when an element or layer is referred to as being "directly formed on" to another element, there are no intervening elements or layers present. Other words used to describe the relationship between elements or layers should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the FIGS. For example, two FIGS. shown in succession may in fact be executed substantially concurrently or may sometimes be executed in the reverse order, depending upon the functionality/acts involved.

Figure 3:
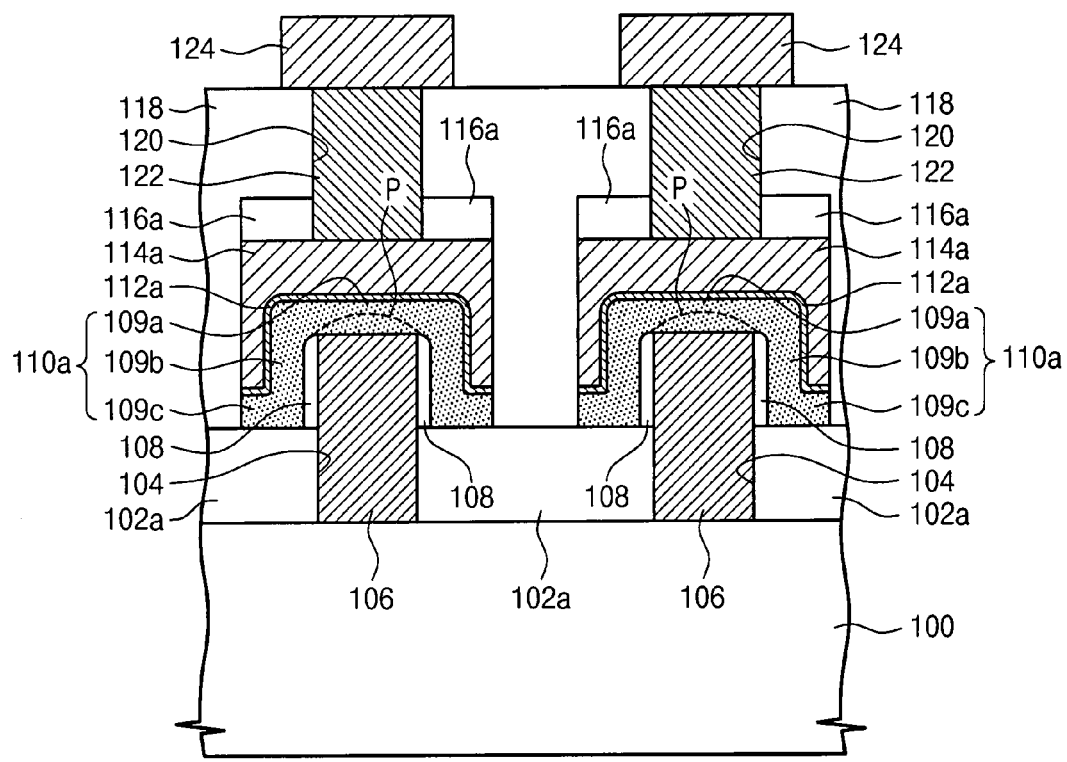
FIG. 3 is a sectional view of a phase change memory device according to an example embodiment.

FIG. 3 is a sectional view of a phase change memory device according to an example embodiment.

Referring to FIG. 3, an interlayer insulating layer 102a may be disposed (or formed) on a semiconductor substrate (hereinafter referred to as "substrate") 100. A lower portion of a heater plug 106 may fill or substantially fill a contact hole 104 penetrating (or formed in) the interlayer insulating layer 102a. The upper portion of the heater plug 106 may protrude (or extend) upward (e.g., vertically) over (and/or above) the top surface of the interlayer insulating layer 102a. The bottom surface of the heater plug 106 may be electrically connected to a switching device. For example, the bottom surface of the heater plug 106 may be electrically connected to a source/drain region of a MOSFET or one terminal of a PN diode.

An insulating spacer 108 may be disposed (or formed) on a side surface of the protruding portion of the heater plug 106. The insulating spacer 108 may have an inner side surface and an outer side surface that face each other. The inner side surface of the insulating spacer 108 may contact the side surface of the protruding portion of the heater plug 106. At least a portion of the outer side surface of the insulating spacer 108 may be a curved surface. The bottom surface of the insulating spacer 108 may contact the top surface of the interlayer insulating layer 102a adjacent to the protruding portion of the heater plug 106.

A phase change pattern 110a (or phase change material pattern) may cover the top surface and the side surface of the protruding portion of the heater plug 106. In at least one example embodiment, the phase change pattern 110a may contact the top surface of the protruding portion of the heater plug 106 and the outer side surfaces of the insulating spacers 108. The insulating spacers 108 may be interposed between the phase change pattern 110a and the protruding portion of the heater plug 106.

In at least this example embodiment, the phase change pattern 110a may include a central portion 109a, sidewall portion 109b and edge portion 109c. The central portion 109a may contact the top surface of the protruding portion of the heater plug 106. The central portion 109a may include a portion of the phase change pattern 110a located higher than the top surface of the protruding portion of the heater plug 106. The central portion 109a may also include a program region P. The sidewall portion 109b may contact the insulating spacer 108, and may have an inner side surface and an outer side surface facing each other. The inner side surface of the sidewall portion 109b may contact the insulating spacer 108 and may extend from the bottom portion of the sidewall portion 109b laterally (e.g., horizontally) away from the heater plug 106. The central portion 109a, the sidewall portion 109b and the edge portion 109c may be connected (e.g., sequentially connected) end to end. In at least this example embodiment, the top surface of the edge portion 109c may be located lower than the top surface of the heater plug 106. For example, the phase change pattern 110a may be cap-shaped (or step-shaped) to cover the protruding portion of the heater plug 106.

The heater plug 106 may be formed of a conductive material with lower or relatively low reactivity against the phase change pattern 110a. For example, the heater plug 106 may be formed of a conductive metal nitride or the like, such as, one selected from the group consisting of TiN, TaN, MoN, NbN, TiSiN, TiAlN, TiBN, ZrSiN, WSiN, WBN, ZrAlN, MoAlN, TaSiN, TaAlN, TiON, TiAlON, WON, TaON, a combination thereof or the like. The insulating spacer 108 may be formed of an insulating material such as silicon nitride, silicon oxide, silicon oxynitride or the like. The phase change pattern 110a may be formed of a phase change material with two multiple (e.g., two) stable states. For example, the phase change pattern 110a may be formed of a compound including at least one chalcogenide element, such as, at least one of Te and Se. The phase change pattern 110a may further include an element selected from the group consisting of Ge, Sb, Bi, Pb, Sn, Ag, As, S, Si, P, O, N, a combination thereof or the like. For example, the phase change pattern 110a may be formed of a compound such as Ge—Sb—Te, As—Sb—Te, As—Ge—Sb—Te, Sn—Sb—Te, Ag—In—Sb—Te, In—Sb—Te, Group 5A element-Sb—Te, Group 6A element-Sb—Te, Group 5A element-Sb—Se, Group 6A element-Sb—Se or the like.

A capping electrode 114a may be disposed on the phase change pattern 110a. The capping electrode 114a may cover the top surface of the central portion 109a, the outer side surface of the sidewall portion 109b and the top surface of the edge portion 109c. The capping electrode 114a may be electrically connected to the top surface of the central portion 109a, the outer side surface of the sidewall portion 109b and the top surface of the edge portion 109c. The capping electrode 114a may include sidewall respectively aligned with the side surface of the edge portions 109c. The sidewall of the capping electrode 114a may have an inner side surface covering the outer side surface of the sidewall portion 109b and an outer side surface facing the inner side surface. The top surface of the capping electrode 114a may be planar or substantially planar. Alternatively, the top surface of the capping electrode 114a may be bent or curved along the shape of the phase change pattern 110a. For example, the capping electrode 114a may be cap-shaped to cover the phase change pattern 110a.

The capping electrode 114a may be formed of a conductive material with lower or relatively low reactivity against the phase change pattern 110a. The capping electrode 114a may be formed of a conductive metal nitride or the like, such as, an element selected from the group consisting of TiN, TaN, MoN, NbN, TiSiN, TiAlN, TiBN, ZrSiN, WSiN, WBN, ZrAlN, MoAlN, TaSiN, TaAlN, TiON, TiAlON, WON, TaON, and combination thereof or the like.

The capping electrode 114a may contact (e.g., directly contact) the phase change pattern 110a such that the capping electrode 114a may be electrically connected to the phase change pattern 110a. In at least some example embodiments, an adhesive conductive pattern 112a may be interposed or arranged between the capping electrode 114a and the phase change pattern 110a. The adhesive conductive pattern 112a may improve and/or enhance the adhesive force between the capping electrode 114a and the phase change pattern 110a. For example, the adhesive conductive pattern 112a may be formed of titanium, tantalum or the like.

A hard mask pattern 116a may be disposed or arranged on the capping electrode 114a. The hard mask pattern 116a may be formed of an insulating material having an etch selectivity with respect to the capping electrode 114a, the adhesive conductive pattern 112a and the phase change pattern 110a. For example, the hard mask pattern 116a may be formed of silicon nitride, silicon oxide, silicon oxynitride or the like.

An upper insulating layer 118 may be disposed or arranged on the resulting structure to cover or substantially cover the surface (e.g., the entire surface) of the substrate 100. The upper insulating layer 118 may be formed of silicon oxide or the like. An interconnection plug 122 may fill or substantially fill an interconnection contact hole 120 penetrating (or formed in) the upper insulating layer 118 and the hard mask pattern 116a. The interconnection plug 122 may be connected to the capping electrode 114a. An interconnection 124 may be disposed or arranged on the upper insulating layer 118. The interconnection 124 may be connected to the interconnection plug 122. For example, the interconnection 124 may be electrically connected to the capping electrode 114a via the interconnection plug 122. The interconnection 124 may correspond to a bit line and/or may be formed of a conductive material such as tungsten (W), copper (Cu), aluminum (Al) or the like. The interconnection 124 may be formed of a conductive material such as W, Cu, Al or the like.

In a phase change memory device according to at least this example embodiment, the top portion of the heater plug 106 may protrude or extend upward over and/or above the top surface of the interlayer insulating layer 102a, and the phase change pattern 110a may cover the protruding or extending portion of the heater plug 106. The insulating spacer 108 may be interposed or arranged between the phase change pattern 110a and the side surface of the protruding portion of the heater plug 106, and the phase change pattern 110a may contact the top surface of the heater plug 106. Accordingly, the program region P of the phase change pattern 110a may be limited and/or restricted to being about the same size as or within the central portion 109a adjacent to the top surface of the heater plug 106. Consequently, the size of the program region P may be limited and/or restricted to reduce the power consumption of the phase change memory device. In addition, the central portion 109a and the sidewall portions 109b of the phase change pattern 110a may be covered with the capping electrode 114a to protect the program region P, thereby suppressing and/or preventing etching of the central portion 109a including the program region P. As a result, malfunctioning of the phase change memory device due to the etch damage of the program region may be suppressed and/or prevented.

FIGS. 4 through 7 are sectional views illustrating a method for fabricating a phase change memory device according to an example embodiment.

Figure 4:
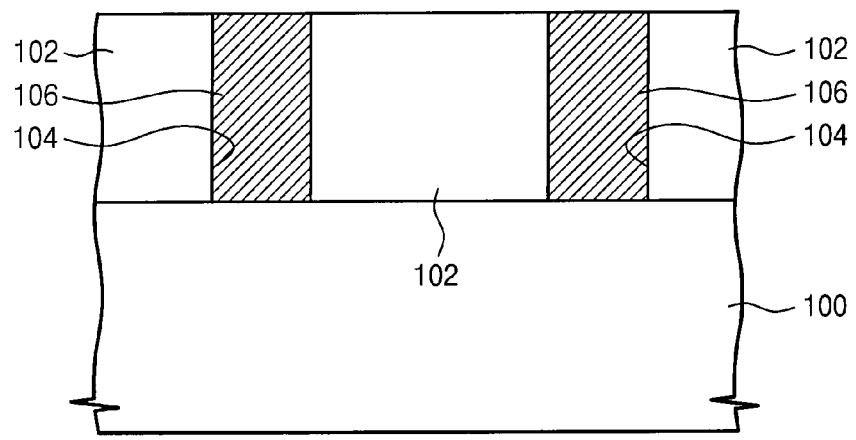
FIGS. 4 through 7 are sectional views illustrating a method for fabricating a phase change memory device according to an example embodiment.

Referring to FIG. 4, an interlayer insulating layer 102 may be formed on a substrate 100. As shown in FIG. 4, the interlayer insulating layer 102 may be formed in a single layer. Alternatively, however, the interlayer insulating layer 102 may have more than a single layer, for example, a multi-layer stack structure including multiple layers which will be discussed in more detail below. The interlayer insulating layer 102 may be formed of a silicon oxide or the like. The interlayer insulating layer 102 may be patterned to form a contact hole 104 exposing the substrate 100, and a heater plug 106 may be formed to fill or substantially fill the contact hole 104. A switching device (not shown) such as an MOSFET, a PN diode or any other suitable switching device may be formed under the interlayer insulating layer 102. The bottom surface of the heater plug 106 may be electrically connected to a source/drain region of the MOSFET or one terminal of the PN diode. In at least some example embodiments, the bottom surface of the heater plug 106 may be connected (e.g., directly connected) to the switching device. Alternatively, another contact plug and/or a buffer conductive pattern may be formed between the heater plug 106 and the switching device.

Figure 5:
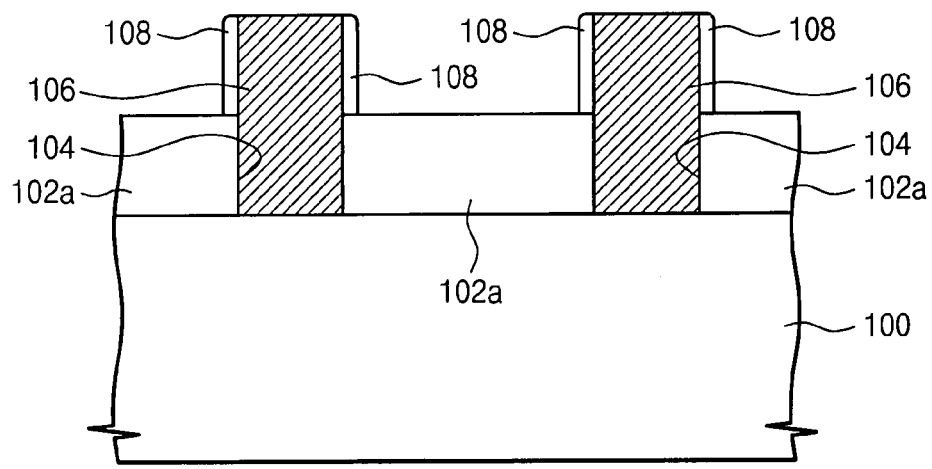

Referring to FIG. 5, the interlayer insulating layer 102 may be recessed to remove the upper portion of the interlayer insulating layer 102, leaving the upper portion of the heater plug 106 protruding or extending. The top surface of the recessed interlayer insulating layer 102a may be located lower than the top surface of the heater plug 106. As described with reference to FIG. 3, the heater plug 106 may be formed of a conductive material, and thus, may have an etch selectivity relative to the interlayer insulating layer 102.

A spacer layer (not shown) may be formed on the recessed interlayer insulating layer 102a. The spacer layer may be conformally or substantially conformally formed on the top surface and/or the side surfaces of the protruding portion of the heater plug 106. An anisotropic overall etching process may be performed on the spacer layer to form insulating spacer 108 on the side surface of the protruding portion of the heater plug 106. The top surface of the heart plug 106 may be exposed. The spacer layer may be formed of a material having an etch selectivity with respect to the recessed interlayer insulating layer 102a. Alternatively, the spacer layer may be formed of the same or substantially the same material as the recessed interlayer insulating layer 102a. For example, the spacer layer may be formed of silicon oxide, silicon nitride, silicon oxynitride or the like.

Figure 6:
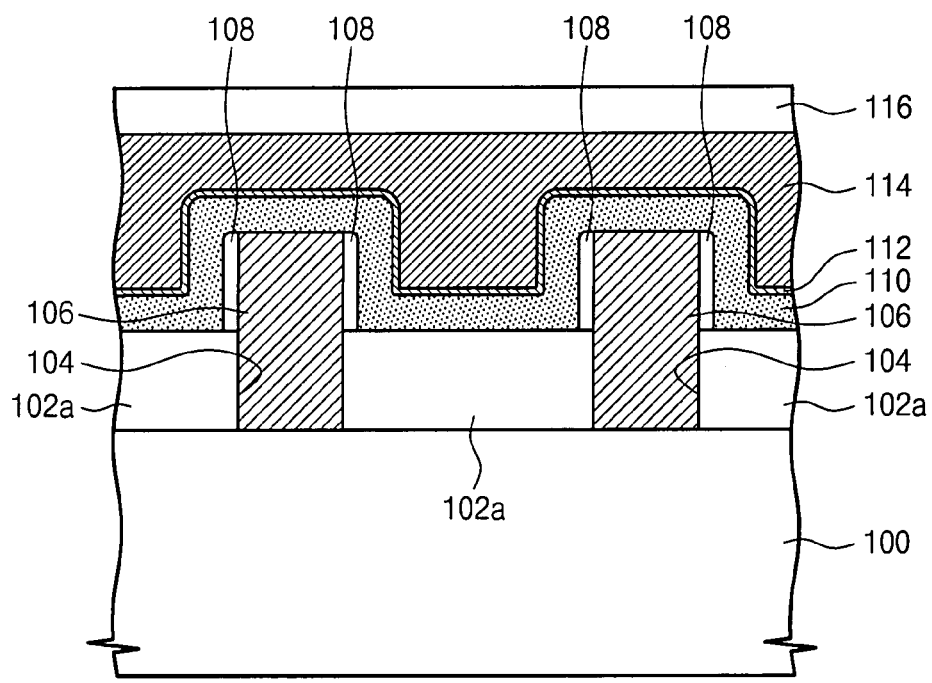

Referring to FIG. 6, a phase change layer 110 may be formed on the substrate 100 with the insulating spacers 108. The phase change layer 110 may be formed such that it bends (or curves) along the protruding portion of the heater plug 106. The phase change layer 110 may be divided into at least three portions, for example, a first portion formed on the top surface of the heater plug 106, a second portion formed on the side surface of the protruding portion of the heater plug 106 and a third portion formed on the recessed interlayer insulating layer 102a. The phase change layer 110 may be continuous. In at least one example embodiment, the top surface of the third portion of the phase change layer 110 may be formed lower than the top surface of the heater plug 106. The phase change layer 110 may be conformally or substantially conformally formed in thickness. For example, the first, second and/or third portions of the phase change layer 110 may have a uniform or substantially uniform thickness. The thickness of the second portion of the phase change layer 110 may be a distance between the outer side surface and the inner side surface of the second portion of the phase change layer 110 contacting the heater plug 106. Alternatively, the first portion of the phase change layer 110 may be formed thicker than the third portion of the phase change layer 110. The phase change layer 110 may be formed using physical vapor deposition (PVD), chemical vapor deposition (CVD), atomic layer deposition (ALD) or any other suitable deposition process. The phase change layer 110 may be formed of the same or substantially the same material as the phase change pattern 110a described above with reference to FIG. 3.

An adhesive conductive layer 112 may be conformally or substantially conformally formed on the phase change layer 110, and a capping conductive layer 114 may be formed on the adhesive conductive layer 112. The adhesive conductive layer 112 may improve and/or enhance the adhesive force between the capping conductive layer 114 and the phase change layer 110. However, in at least some example embodiments, the adhesive conductive layer 112 may be omitted. The adhesive conductive layer 112 may be formed of, for example, titanium (Ti), tantalum (Ta) or the like. The capping conductive layer 114 may be conformally or substantially conformally formed. Alternatively, the top surface of the capping conductive layer 114 may be formed to be planar or substantially planar. The capping conductive layer 114 may be formed of the same or substantially the same material as the capping electrode 114a described above with regard to FIG. 3. A hard mask layer 116 may be formed on the capping conductive layer 114. The hard mask layer 116 may be formed of an insulating material having an etch selectivity with respect to the capping conductive layer 114, the adhesive conductive layer 112 and/or the phase change layer 110. For example, the hard mask layer 116 may be formed of a silicon nitride layer, a silicon oxide layer, a silicon oxynitride layer or the like.

Figure 7:
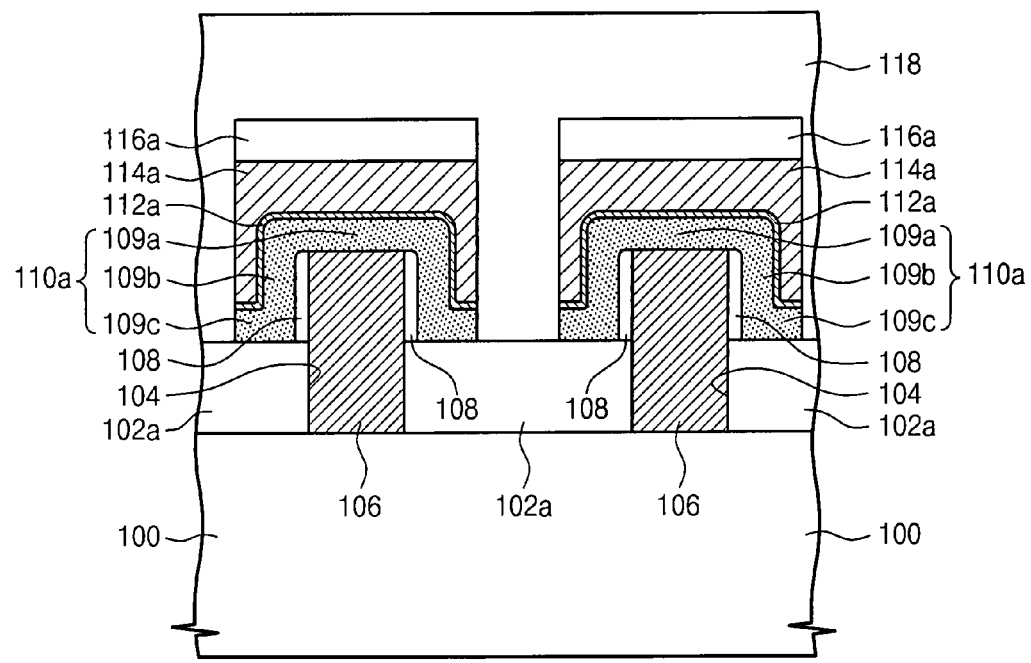

Referring to FIG. 7, a photosensitive pattern may be used to pattern (e.g., sequentially pattern) the hard mask layer 116, the capping conductive layer 114, the adhesive conductive layer 112 and the phase change layer 110, thereby forming a phase change pattern 110a, an adhesive conductive pattern 112a, a capping electrode 114a and a hard mask pattern 116a that are stacked, for example, sequentially. The capping electrode 114a may be formed of a portion of the capping conductive layer 114. The phase change pattern 110a may include a central portion 109a, a sidewall portion 109b and an edge portion 109c. The central portion 109a and the sidewall portion 109b may correspond to the first portion and the second portion of the phase change layer 110, respectively. The edge portion 109c may correspond to a portion of the third portion of the phase change layer 110. The capping electrode 114a may cover or substantially cover the top surfaces of the central portion 109a, the sidewall portions 109b and/or the edge portions 109c.

During the patterning process, the capping electrode 114a may cover or substantially cover the first and second portions of the phase change layer 110. Accordingly, the central portion 109a including a program region may be better protected by the capping electrode 114a during an etching process of the patterning process. In at least one example embodiment, only the side surface of the edge portion 109c of the phase change pattern 110a may be exposed during the etching process. Consequently, the central portion 109a of the phase change pattern 110a, which includes the program region, may be better protected from an etch damage, thereby suppressing and/or preventing malfunction of the phase change memory device.

An upper insulating layer 118 may be formed on the resulting structure to cover the upper surface (e.g., the entire upper surface) of the substrate 100. The upper insulating layer 118 may be patterned to form a contact hole 120 of FIG. 3, and an interconnection plug 122 of FIG. 3 may be formed to fill or substantially fill the contact hole 120. The interconnection 124 of FIG. 3 may be formed, to implement the phase change memory device of FIG. 3.

Although the interlayer insulating layer 102 has been described as being formed in a single layer, the interlayer insulating layer may include multiple layers in the form of, for example, a multi-layer (e.g., dual layer) stack structure. This will be described in detail with reference to FIGS. 8 and 9.

Figure 8:
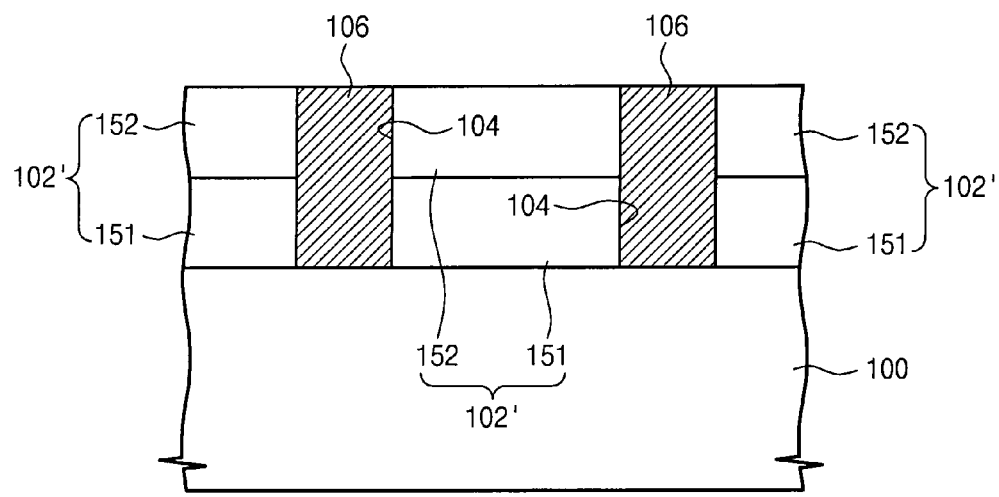
FIGS. 8 and 9 are sectional views illustrating a method of forming a protruding heater plug of a phase change memory device according to another example embodiment.
Figure 9:
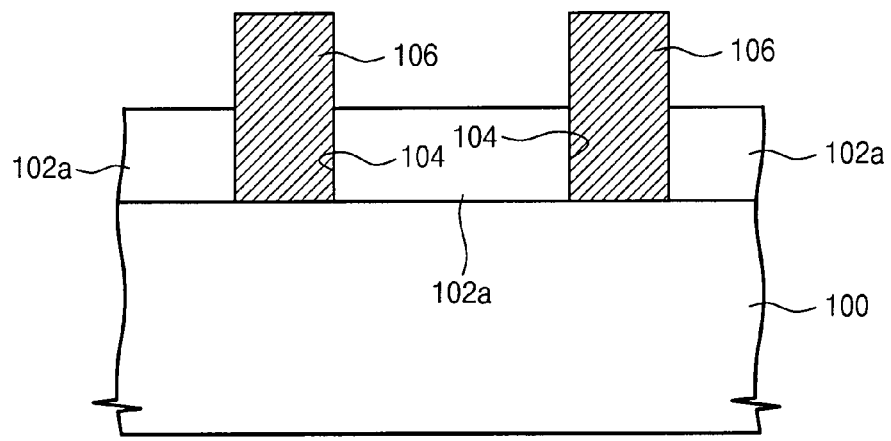

FIGS. 8 and 9 are sectional views illustrating a method for forming a protruding heater plug of a phase change memory device according to another example embodiment.

Referring to FIG. 8, an interlayer insulating layer 102' may be formed on a substrate 100. The interlayer insulating layer 102' may be formed in a multi-layer (e.g., dual layer) stack structure including at least a first layer 151 and a second layer 152 stacked sequentially. The second layer 152 may be formed of, for example, an insulating material having an etch selectivity with respect to the first layer 151. In at least one example, the first layer 151 may be formed of silicon nitride, silicon oxynitride or the like, while the second layer may be formed of silicon oxide. Alternatively, the first layer 151 may be formed of silicon oxide, while the second layer may be formed of silicon nitride or silicon oxynitride or the like.

The interlayer insulating layer 102' may be patterned to form a contact hole 104 exposing the substrate 100, and a heater plug 106 may be formed to fill or substantially fill the contact hole 104.

Referring to FIG. 9, the interlayer insulating layer 102' may be recessed such that the upper portion of the heater plug 106 protrudes. According to at least some example embodiments, the second layer 152 may be removed during the recessing process. Because the second layer 152 has an etch selectivity with respect to the first layer 151, the first layer 151 may remain during the recessing process. Accordingly, the recessed interlayer insulating layer 102a may correspond to the first layer 151. The recessing process may be performed using wet etching, dry etching or the like.

Although not shown in FIG. 8 or 9, the insulating spacers 108 of FIG. 5 may be formed on the side surfaces of the protruding portion of the heater plug 106. The subsequent processes may be performed in the same or substantially the same manner as described with reference to FIGS. 6 and 7.

As described above, the upper portion of the interlayer insulating layer 102' may be removed using the etch selectivity between the first layer 151 and the second layer 152. Accordingly, the height of the protruding portion of the heater plug 106 may be reproducibly obtained.

Figure 10:
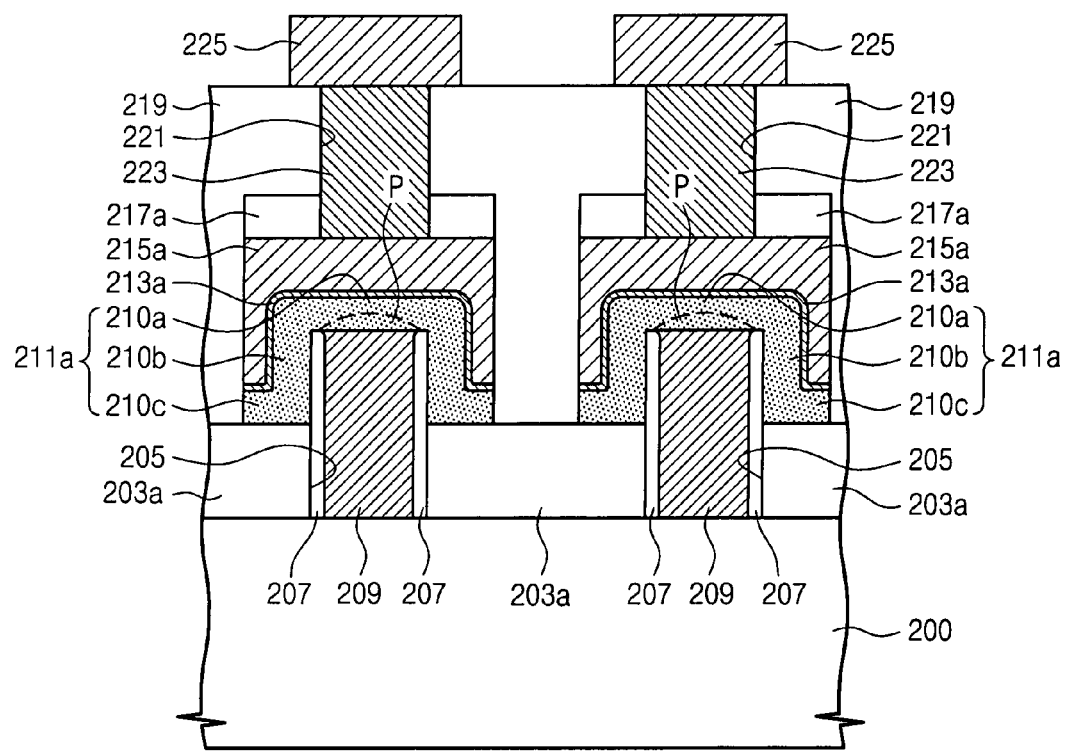
FIG. 10 is a sectional view of a phase change memory device according to an example embodiment.

FIG. 10 is a sectional view of a phase change memory device according to another example embodiment.

Referring to FIG. 10, an interlayer insulating layer 203a may be disposed or arranged on a substrate 200. A contact hole 205 may be formed to penetrate the interlayer insulating layer 203a. The lower portion of a heater plug 209 may be disposed or arranged within the contact hole 205. The upper portion of the heater plug 209 may protrude or extend upward (e.g., vertically) over and/or above the top surface of the interlayer insulating layer 203a. The bottom surface of the heater plug 209 may be electrically connected to a switching device (not shown). For example, the bottom surface of the heater plug 209 may be electrically connected to a source/drain region of a MOSFET, one terminal of a PN diode or the like.

An insulating spacer 207 may be disposed or arranged on a side surface of the protruding portion of the heater plug 209. The insulating spacer 207 may extend downward and be disposed or arranged between the lower portion of the heater plug 209 and the inner side surface of the contact hole 205. For example, the insulating spacer 207 may cover or substantially cover the side surface (e.g., the entire side surface) of the heater plug 209. The upper portion of the insulating spacer 207 may be disposed on the side surface of the protruding portion of the heater plug 209, and the lower portion of the insulating spacer 207 may be disposed between the lower portion of the heater plug 209 and the inner side surface of the contact hole 205. The upper portion of the insulating spacer 207 may protrude upward over the top surface of the interlayer insulating layer 203a. The insulating spacer 207 may have an inner side surface contacting the side surface of the heater plug 209 and an outer side surface facing the inner side surface. A portion of the inner side surface of the insulating spacer 207 may be curved.

A phase change pattern 211a may be disposed or arranged on the interlayer insulating layer 203a, and may contact the top surface of the protruding portion of the heater plug 209 and the outer side surfaces of the insulating spacers 207. For example, the upper portion of the insulating spacer 207 may be interposed or arranged between the phase change pattern 211a and the protruding portion of the heater plug 209. The phase change pattern 211a may include a central portion 210a, a sidewall portion 210b and an edge portion 210c. The central portion 210a may contact the top surface of the protruding portion of the heater plug 209, the sidewall portion 210b may contact the upper portion of the insulating spacer 207 and the edge portion 210c may extend, for example, laterally from the lower portion of the sidewall portion 210b. The central portion 210a may be a portion of the phase change pattern 110a located higher than the top surface of the heater plug 209. The sidewall portion 210b may have an inner side surface and an outer side surface that face each other. The inner side surface of the sidewall portion 210b may contact the protruding portion of the insulating spacer 207. The central portion 210a may include a program region P. The top surface of the edge portion 210c may be located lower than the top surface of the central portion 210a. As in the above-described example, the phase change pattern 211a may be cap-shaped (or step-shaped) to cover or substantially cover the protruding portion of the heater plug 209.

The heater plug 209 may be formed of a conductive material with lower or relatively low reactivity against the phase change pattern 211a. The heater plug 209 may be formed of the same or substantially the same material as the heater plug 106 of the first above-described example embodiment. The material for the insulating spacer 207 will be described in more detail below. The phase change pattern 211a may be formed of a phase change material with multiple (e.g., two) stable states. The phase change pattern 211a may be formed of the same or substantially the same material as the phase change pattern 110a described above with regard to FIG. 3.

A capping electrode 215a may be disposed or arranged on the phase change pattern 211a. The capping electrode 215a may cover the top surface of the central portion 210a, the outer side surface of the sidewall portion 210b and the top surface of the edge portion 210c. The capping electrode 215a may be electrically connected to the top surface of the central portion 210a, the outer side surface of the sidewall portion 210b and the top surface of the edge portion 210c. The capping electrode 215a may contact (e.g., directly contact) the phase change pattern 211a. Alternatively, an adhesive conductive pattern 213a may be interposed or arranged between the capping electrode 215a and the phase change pattern 211a to improve and/or enhance the adhesive force there between. The adhesive conductive pattern 213a may be formed of the same or substantially the same material as the adhesive conductive pattern 112a of the above-described example embodiment. The capping electrode 215a may include a sidewall aligned with the side surface of respective edge portions 210c. In addition, the capping electrode 215a may include an inner side surface covering or substantially covering the outer side surface of the sidewall portion 210b. As illustrated in FIG. 10, the top surface of the capping electrode 215a may be planar or substantially planar. Alternatively, the top surface of the capping electrode 215a may be bent or curved along the shape of the phase change pattern 211a. For example, the capping electrode 215a may be cap-shaped (or step-shaped) to cover the phase change pattern 211a. Consequently, the capping electrode 215a and the phase change pattern 211a may form a dual cap that covers or substantially covers the protruding portion of the heater plug 209. The capping electrode 215a may be formed of a conductive material with lower or relatively low reactivity against the phase change pattern 211a. The capping electrode 215a may be formed of the same or substantially the same material as the capping electrode 114a of the above-described example embodiment.

A hard mask pattern 217a may be disposed on the capping electrode 215a. The hard mask pattern 217a may be formed of an insulating material having an etch selectivity with respect to the capping electrode 215a, the adhesive conductive pattern 213a and/or the phase change pattern 211a. For example, the hard mask pattern 217a may be formed of silicon nitride, silicon oxide, silicon oxynitride or the like.

An upper insulating layer 219 may be disposed or arranged on the resulting structure to cover or substantially cover the surface (e.g., the entire surface) of the substrate 200. An interconnection plug 223 may fill or substantially fill an interconnection contact hole 221 penetrating the upper insulating layer 219 and the hard mask pattern 217a to expose the capping electrode 215a. An interconnection 225 may be disposed or arranged on the upper insulating layer 219 such that the interconnection 225 may be connected to the interconnection plug 223. In at least one example, the interconnection 225 may be electrically connected to the capping electrode 215a via the interconnection plug 223. The upper insulating layer 219, the interconnection plug 223 and/or the interconnection 225 may be formed of the same or substantially the same materials as the upper insulating layer 118, the interconnection plug 122 and/or the interconnection 124, respectively.

In a phase change memory device according to at least this example embodiment, the upper portion of the heater plug 209 may protrude or extend upward over the top surface of the interlayer insulating layer 102a, and the phase change pattern 211a may cover or substantially cover the protruding portion of the heater plug 209. The insulating spacer 207 may be interposed or arranged between the phase change pattern 211a and the protruding portion of the heater plug 209 and/or between the inner side surface of the contact hole 205 and the lower portion of the heater plug 209. Accordingly, the program region P of the phase change pattern 211a may be restricted and/or limited to about the same size as or within the central portion 210a contacting the top surface of the heater plug 209. Consequently, the size of the program region P may be restricted and/or limited to reduce power consumption. In addition, the central portion 210a and the sidewall portions 210b of the phase change pattern 211a may be covered or substantially covered with the capping electrode 215a. Consequently, the central portion 210a including the program region P may be better protected from etch damage. Therefore, malfunctioning of the phase change memory device due to etch damage of the program region may be suppressed and/or prevented.

FIGS. 11 through 15 are sectional views illustrating a method for fabricating a phase change memory device according to another example embodiment.

Figure 11:
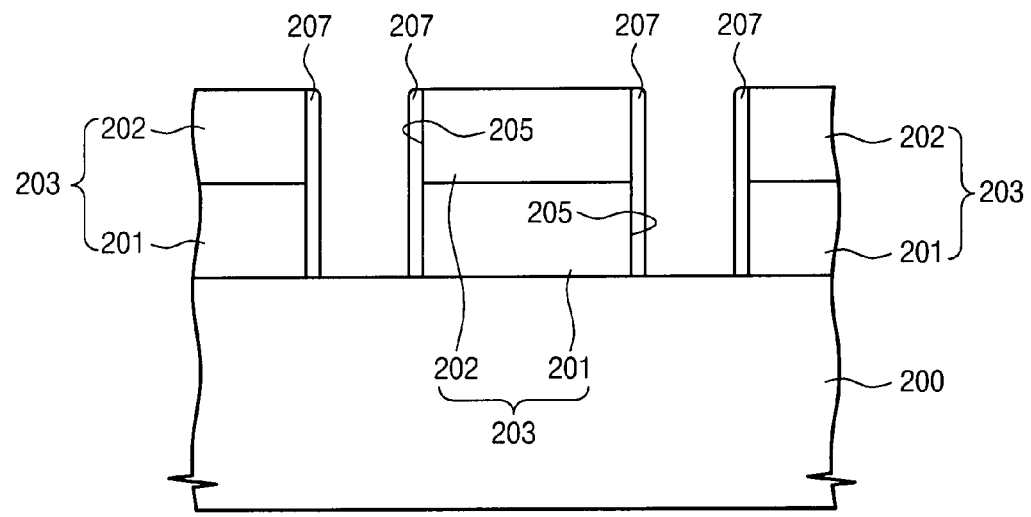
FIGS. 11 through 15 are sectional views illustrating a method for fabricating a phase change memory device according to an example embodiment.

Referring to FIG. 11, an interlayer insulating layer 203 may be formed on a substrate 200. The interlayer insulating layer 203 may be formed in a multi-layer stack structure including at least a first layer 201 and a second layer 202 that are stacked (e.g., sequentially stacked). The second layer 202 may be formed of a material having an etch selectivity with respect to the first layer 201.

The interlayer insulating layer 203 may be patterned to form a contact hole 205 exposing the substrate 200. A spacer layer (not shown) may be conformally or substantially conformally formed on the substrate 200 with the contact hole 205. An anisotropic etching process or the like may be performed on the spacer layer until the substrate 200 under the contact hole 205 is exposed, thereby forming insulating spacers 207 on an inner side surface of the contact hole 205. The second layer 202 of the interlayer insulating layer 203 may have an etch selectivity with respect to the insulating spacer 207. When the insulating spacer 207 is formed, the top surface of the second layer 202 of the interlayer insulating layer may be exposed along with the substrate 200 under the contact hole 205.

In at least one example embodiment, the first layer 201 may be formed of silicon oxide, and the second layer 202 may be formed of silicon nitride, silicon oxynitride or the like. In this example, the insulating spacer 207 may be formed of silicon oxide or the like. Alternatively, the first layer 201 may be formed of silicon nitride, silicon oxynitride or the like, and the second layer 202 may be formed of silicon oxide. In this example, the insulating spacer 207 may be formed of silicon nitride, silicon oxynitride or the like.

Figure 12:
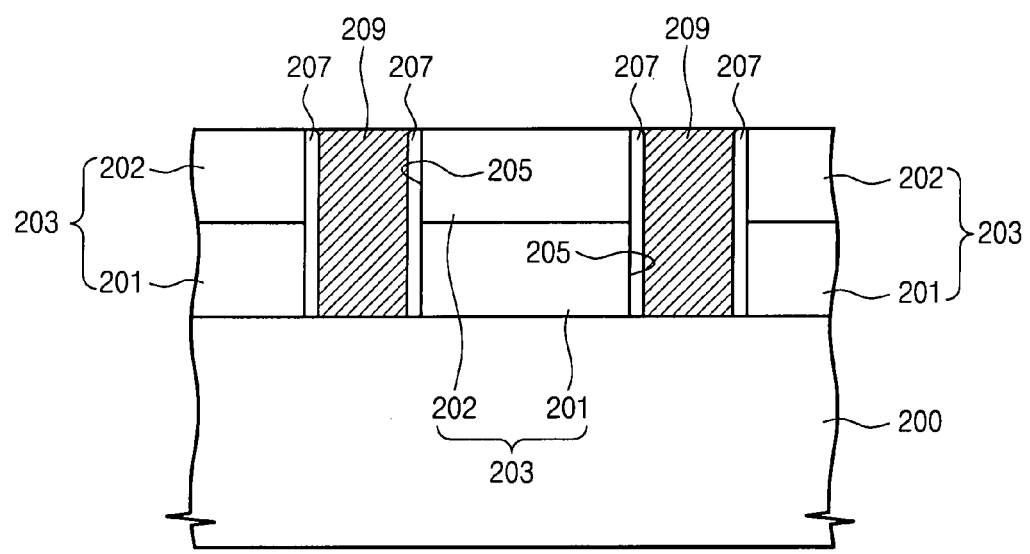

Referring to FIG. 12, a conductive layer filling the contact hole 205 may be formed on the substrate 200 with the insulating spacers 207. The conductive layer may be planarized until the interlayer insulating layer 203 is exposed, thereby forming a heater plug 209 in the contact hole 205. The insulating spacer 207 may be interposed between the heater plug 209 and the inner side surface of the contact hole 205.

Figure 13:
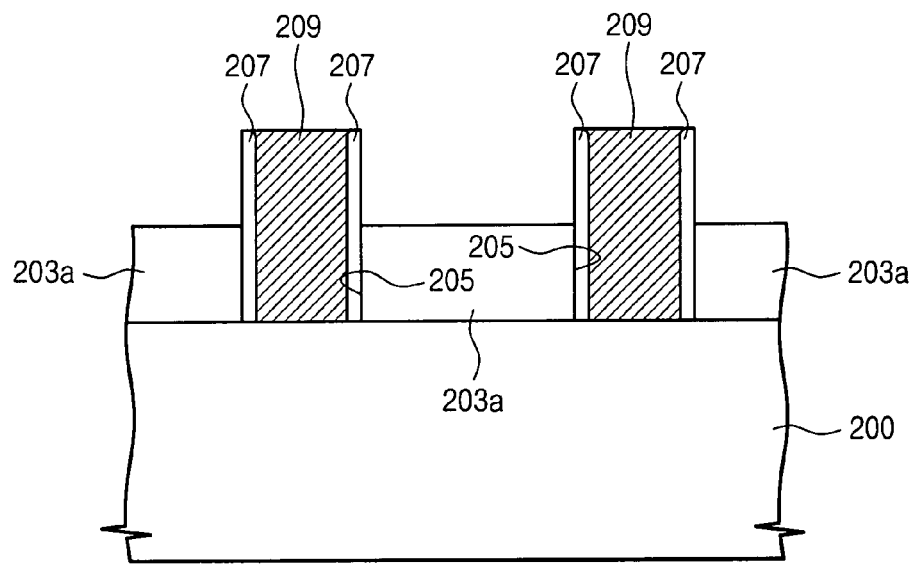

Referring to FIG. 13, an etching process may be performed to remove the upper portion (e.g., the second layer 202) of the interlayer insulating layer 203. Accordingly, the upper portion of the heater plug 209 and the upper portion of the insulating spacer 207 may protrude, and thus, the outer side surface of the protruding portion of the insulating spacer 207 may be exposed. The etched interlayer insulating layer 203a may include the first layer 201.

In another example, the interlayer insulating layer 203 may be formed in a single layer as in the above-described example embodiment. In this example, the interlayer insulating layer 203 may have an etch selectivity with respect to the insulating spacer 207. The upper portion of the single-layered interlayer insulating layer 203 may be removed by etching.

Figure 14:
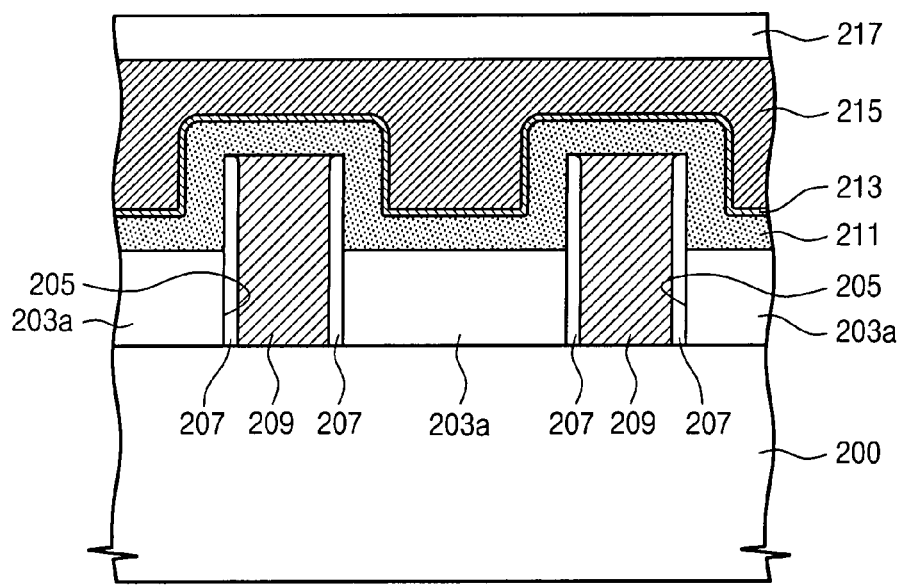

Referring to FIG. 14, a phase change layer 211, an adhesive layer 213, a capping conductive layer 215 and a hard mask layer 217 may be formed (e.g., sequentially formed) on the substrate 200 and the etched interlayer insulating layer 203a. The phase change layer 211 may be formed such that the phase change layer 211 bends or curves along the protruding portion of the heater plug 209. Accordingly, the phase change layer 211 may include a first portion formed on the top surface of the heater plug 209, a second portion formed on the side surface of the protruding portion of the heater plug 209 and a third portion formed on the etched interlayer insulating layer 203a. The top surface of the third portion of the phase change layer 211 may be formed lower than the top surface of the heater plug 209.

The first, second and third portions of the phase change layer 211 may be formed uniformly or substantially uniformly in thickness. Alternatively, the first portion of the phase change layer 211 may be formed thicker than the third portion of the phase change layer 211. The phase change layer 211 may be formed by PVD, CVD, ALD or the like. The capping conductive layer 215 may be conformally or substantially conformally formed. Alternatively, a portion of the capping conductive layer 215 on the third portion of the phase change layer 211 may be thicker than a portion of the capping conductive layer 215 on the first portion of the phase change layer 211. The top surface of the capping conductive layer 215 may be planar or substantially planar. The phase change layer 211, the adhesive conductive layer 213, the capping conductive layer 215 and/or the hard mask layer 217 may be formed of the same or substantially the same materials as the phase change layer 110, the adhesive conductive layer 112, the capping conductive layer 114 and/or the hard mask layer 116 of the FIG. 6, respectively.

Figure 15:
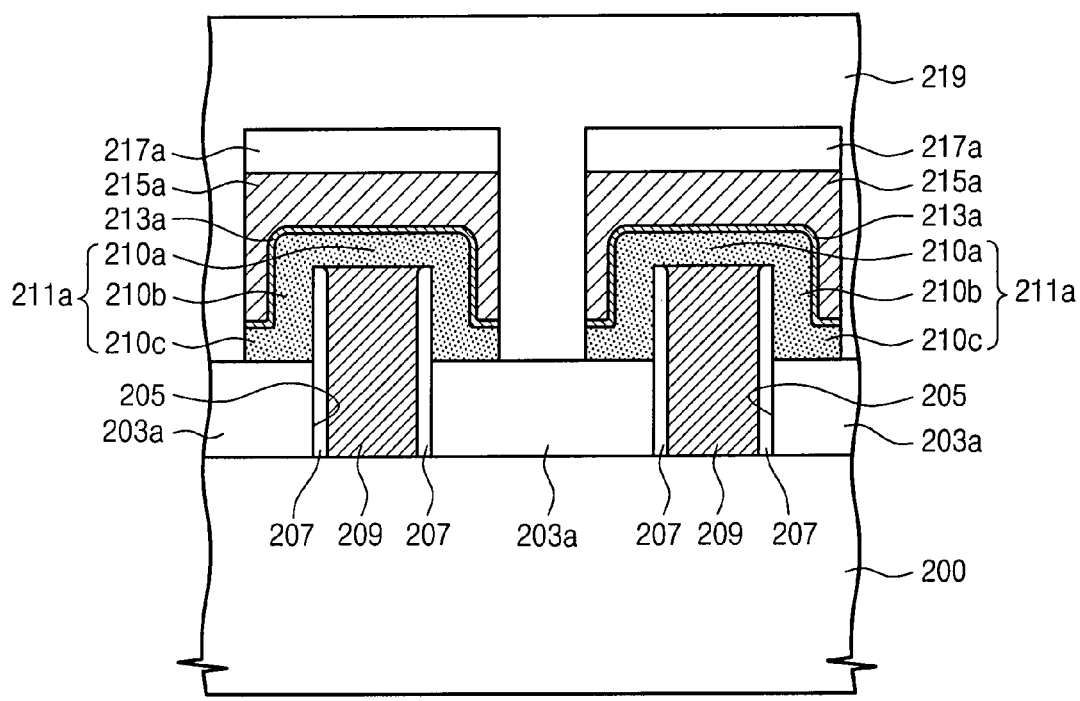

Referring to FIG. 15, the hard mask layer 217, the capping conductive layer 215, the adhesive conductive layer 213 and the phase change layer 211 may be patterned (e.g., sequentially patterned) to form a phase change pattern 211a, an adhesive conductive pattern 213a, a capping electrode 215a and a hard mask pattern 217a that are stacked (e.g., sequentially stacked). The phase change pattern 211a may include a central portion 210a, a sidewall portion 210b and an edge portion 210c. The central portion 210a, the sidewall portion 210b and the edge portion 210c may correspond to the first portion, the second portion and a portion of the third portion of the phase change layer 211, respectively. The capping electrode 215a may cover or substantially cover the top surfaces of the central portion 210a, the sidewall portion 210b and/or the edge portion 210c. The capping electrode 215a may have sidewalls aligned with the side surface of respective edge portions 210c.

During the patterning process, the capping electrode 215a may cover or substantially cover the first and/or second portions of the phase change layer 211. Accordingly, the central portion 210a including a program region may be better protected from etch damage. Consequently, malfunction of the phase change memory device due to etch damage may be suppressed and/or prevented.

An upper insulating layer 219 may be formed on the resulting structure to cover or substantially cover the upper surface (e.g., the entire upper surface) of the substrate 200. The upper insulating layer 219 and the hard mask pattern 217a may be patterned (e.g., sequentially patterned) to form the interconnection contact hole 221 of FIG. 10, and the interconnection plug 223 of FIG. 10 may be formed to fill or substantially fill the interconnection contact hole 221. The interconnection 225 of FIG. 10 may be formed to implement the phase change memory device of FIG. 10.

As described above, the upper portion of the heater plug may protrude or extend upward over the top surface of the interlayer insulating layer. Accordingly, the phase change pattern may be formed to cover or substantially cover the protruding portion of the heater plug. The insulating spacer may be interposed or arranged between the phase change pattern and the side surface of the protruding portion of the heater plug. The capping electrode may better protect the central portion and/or sidewall portions of the phase change pattern. Consequently, the central portion including the program region may be better protected from etch damage, thereby suppressing and/or preventing malfunction of the phase change memory device. In addition, the program region may be restricted and/or limited to about the same size as or within the central portion adjacent to the top surface of the heater plug. Consequently, power consumption of the phase change memory device may be reduced.

In example embodiments, the phase change material may include chalcogenide alloys such as germanium-antimony-tellurium (Ge—Sb—Te), arsenic-antimony-tellurium (As—Sb—Te), tin-antimony-tellurium (Sn—Sb—Te), or tin-indium-antimony-tellurium (Sn—In—Sb—Te), arsenic-germanium-antimony-tellurium (As—Ge—Sb—Te). Alternatively, the phase change material may include an element in Group VA-antimony-tellurium such as tantalum-antimony-tellurium (Ta—Sb—Te), niobium-antimony-tellurium (Nb—Sb—Te) or vanadium-antimony-tellurium (V—Sb—Te) or an element in Group VA-antimony-selenium such as tantalum-antimony-selenium (Ta—Sb—Se), niobium-antimony-selenium (Nb—Sb—Se) or vanadium-antimony-selenium (V—Sb—Se). Further, the phase change material may include an element in Group VIA-antimony-tellurium such as tungsten-antimony-tellurium (W—Sb—Te), molybdenum-antimony-tellurium (Mo—Sb—Te), or chrome-antimony-tellurium (Cr—Sb—Te) or an element in Group VIA-antimony-selenium such as tungsten-antimony-selenium (W—Sb—Se), molybdenum-antimony-selenium (Mo—Sb—Se) or chrome-antimony-selenium (Cr—Sb—Se).

Although the phase change material is described above as being formed primarily of ternary phase-change chalcogenide alloys, the chalcogenide alloy of the phase change material could be selected from a binary phase-change chalcogenide alloy or a quaternary phase-change chalcogenide alloy. Example binary phase-change chalcogenide alloys may include one or more of Ga—Sb, In—Sb, In—Se, $Sb_2$—$Te_3$ or Ge—Te alloys; example quaternary phase-change chalcogenide alloys may include one or more of an Ag—In—Sb—Te, (Ge—Sn)—Sb—Te, Ge—Sb—(Se—Te) or $Te_{81}$—$Ge_{15}$—$Sb_2$—$S_2$ alloy, for example.

In an example embodiment, the phase change material may be made of a transition metal oxide having multiple resistance states. For example, the phase change material may be made of at least one material selected from the group consisting of NiO, $TiO_2$, HfO, $Nb_2O_5$, ZnO, $WO_3$, and CoO or GST ($Ge_2Sb_2Te_5$) or PCMO($Pr_xCa_{1-x}MnO_3$). The phase change material may be a chemical compound including one or more elements selected from the group consisting of S, Se, Te, As, Sb, Ge, Sn, In and Ag.

It will be apparent to those skilled in the art that various modifications and variations may be made to the present invention. Thus, it is intended that the present invention covers the modifications and variations of this invention provided they come within the scope of the appended claims and their equivalents.

What is claimed is:

1. A phase change memory device comprising:
   an interlayer insulating layer disposed on a substrate;
   a heater plug having a lower portion and an upper portion, the lower portion being disposed in a contact hole formed within the interlayer insulating layer, and the upper portion protruding upward above a top surface of the interlayer insulating layer;
   a phase change material pattern disposed on the interlayer insulating layer, the phase change material pattern covering a top surface and side surfaces of the protruding portion of the heater plug, and the phase change material pattern contacting the top surface of the upper portion of the heater plug;
   an insulating spacer arranged between the phase change material pattern and the side surface of the protruding portion of the heater plug; and
   a capping electrode disposed on the phase change material pattern.

2. The phase change memory device of claim 1, wherein a bottom surface of the insulating spacer contacts the top surface of the interlayer insulating layer.

3. The phase change memory device of claim 1, wherein the insulating spacer extends downward and is interposed between the lower portion of the heater plug and an inner side surface of the contact hole.

4. The phase change memory device of claim 1, wherein the phase change material pattern includes,
   a central portion contacting the top surface of the protruding portion of the heater plug,
   a sidewall portion contacting the insulating spacer, and
   an edge portion extending laterally from a bottom portion of the sidewall portion,
   wherein a top surface of the edge portion is located lower than a top surface of the protruding portion of the heater plug.

5. The phase change memory of claim 4, wherein the capping electrode covers a top surface of the central portion, an outer side surface of the sidewall portion and the top surface of the edge portion.

6. The phase change memory device of claim 4, wherein the capping electrode includes an outer side surface aligned with a side surface of the edge portion.

7. The phase change memory device of claim 1, further including,
   an adhesive conductive pattern arranged between the phase change material pattern and the capping electrode.

8. A phase change memory device, comprising:
   an interlayer insulating layer disposed on a substrate;
   a heater plug having a lower portion and an upper portion, the lower portion being disposed in a contact hole formed within the interlayer insulating layer, and the upper portion protruding upward above a top surface of the interlayer insulating layer;
   a phase change material pattern disposed on the interlayer insulating layer, the phase change material pattern covering a top surface and side surfaces of the protruding portion of the heater plug, and the phase change material pattern contacting the top surface of the upper portion of the heater plug;
   an insulating spacer arranged between the phase change material pattern and the side surface of the protruding portion of the heater plug;
   a capping electrode disposed on the phase change material pattern;
   an upper insulating layer covering the upper surface of the substrate;
   a hard mask pattern disposed on the capping electrode, the hard mask pattern being arranged between the capping electrode and the upper insulating layer;
   an interconnection plug penetrating the upper insulating layer and connected to the capping electrode; and
   an interconnection disposed on the upper insulating layer and connected to the interconnection plug,
   wherein the interconnection plug penetrates the upper insulating layer and the hard mask pattern, and is connected to the capping electrode.

9. A method for fabricating a phase change memory device, comprising:
- patterning an interlayer insulating layer on a substrate to form a contact hole;
- forming a heater plug and an insulating spacer, the heater plug having a lower portion and an upper portion, the lower portion being disposed in the contact hole, and the upper portion protruding upward over the top surface of the interlayer insulating layer, the insulating spacer arranged at at least a portion of a side surface of the heater plug;
- forming a phase change material pattern contacting the insulating spacer and a top surface of the heater plug on the interlayer insulating layer; and
- forming a capping electrode on the phase change material pattern.

10. The method of claim 9, wherein the forming of the heater plug and the insulating spacer includes,
- forming a heater plug filling the contact hole,
- removing an upper portion of the interlayer insulating layer such that the upper portion of the heater plug protrudes upward over the top surface of the interlayer insulating layer, and
- forming an insulating spacer on each side surface of the protruding portion of the heater plug.

11. The method of claim 10, wherein the phase change material pattern is formed to include,
- a central portion contacting a top surface of the protruding portion of the heater plug,
- a sidewall portion contacting the insulating spacer, and
- an edge portion extending laterally from a bottom portion of the sidewall portion,
- wherein a top surface of the edge portion is formed lower than a top surface of the protruding portion of the heater plug, and the capping electrode covers a top surface of the central portion, an outer side surface of the sidewall portion, and the top surface of the edge portion.

12. The method of claim 10, wherein the forming of the phase change material pattern and the capping electrode includes,
- forming a substantially conformal phase change layer on the substrate,
- forming a capping conductive layer on the phase change layer, and
- sequentially patterning the capping conductive layer and the phase change layer to form the phase change material pattern and the capping electrode.

13. The method of claim 10, further including,
- forming an adhesive conductive pattern between the capping electrode and the phase change material pattern.

14. The method of claim 10, wherein the interlayer insulating layer is formed in a single layer or in a multi-layer stack, the multi-layer stack including at least a first layer and a second layer, the second layer being formed of an insulating material having an etch selectivity with respect to the first layer.

15. The method of claim 9, wherein the forming of the heater plug and the insulating spacer includes,
- forming an insulating spacer on an inner side surface of the contact hole,
- forming a heater plug filling the contact hole having the insulating spacer, and
- removing the upper portion of the interlayer insulating layer to protrude the upper portion of the heater plug and the upper portion of the insulating spacer.

16. The method of claim 15, wherein the phase change material pattern is formed to include,
- a central portion contacting a top surface of the protruding portion of the heater plug,
- a sidewall portion contacting the protruding portion of the insulating spacer, and
- an edge portion extending laterally from a bottom portion of the sidewall portion,
- wherein a top surface of the edge portion is formed lower than the top surface of the protruding portion of the heater plug, and the capping electrode covers a top surface of the central portion, an outer side surface of the sidewall portion, and the top surface of the edge portion.

17. The method of claim 16, wherein the forming of the phase change material pattern and the capping electrode includes,
- forming a substantially conformal phase change layer on the substrate having the protruding portions of the insulating spacer and the heater plug,
- forming a capping conductive layer on the phase change layer, and
- sequentially patterning the capping conductive layer and the phase change layer to form the phase change material pattern and the capping electrode.

18. The method of claim 15, further including,
- forming an adhesive conductive pattern between the capping electrode and the phase change material pattern.

19. The method of claim 15, wherein the interlayer insulating layer is formed in a single layer, and the insulating spacer is formed of an insulating material having an etch selectivity with respect to the interlayer insulating layer.

20. The method of claim 15, wherein the interlayer insulating layer is formed in a multi-layer stack including at least a first layer and a second layer, the second layer being formed of an insulating material having an etch selectivity with respect to the first layer and the insulating spacer.

* * * * *